United States Patent
Tiwari

(10) Patent No.: US 7,358,170 B2
(45) Date of Patent: Apr. 15, 2008

(54) METHODS OF FORMING CONDUCTIVE INTERCONNECTS, AND METHODS OF DEPOSITING NICKEL

(75) Inventor: Chandra Tiwari, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 478 days.

(21) Appl. No.: 11/149,578

(22) Filed: Jun. 9, 2005

(65) Prior Publication Data

US 2005/0287305 A1 Dec. 29, 2005

Related U.S. Application Data

(62) Division of application No. 10/879,366, filed on Jun. 28, 2004, now Pat. No. 6,933,231.

(51) Int. Cl.
*H01L 21/20* (2006.01)
*H01L 21/4763* (2006.01)
*H01L 21/44* (2006.01)
*H01L 21/311* (2006.01)
*H01L 21/302* (2006.01)
*H01L 21/31* (2006.01)
*H01L 23/48* (2006.01)

(52) U.S. Cl. ............ 438/584; 438/618; 438/622; 438/623; 438/624; 438/625; 438/629; 438/637; 438/638; 438/639; 438/640; 438/648; 438/668; 438/672; 438/675; 438/678; 438/700; 438/713; 438/778; 257/758; 257/759; 257/760; 257/766; 257/774

(58) Field of Classification Search .......... None
See application file for complete search history.

(56) References Cited

U.S. PATENT DOCUMENTS

| | | | |
|---|---|---|---|
| 3,898,352 A * | 8/1975 | Flowers .................. 438/678 |
| 4,066,804 A | 1/1978 | Andrews |
| 5,269,838 A | 12/1993 | Inoue et al. |
| 5,795,828 A * | 8/1998 | Endo et al. .............. 438/678 |
| 6,174,353 B1 | 1/2001 | Yuan et al. |
| 6,238,749 B1 | 5/2001 | Willard et al. |
| 6,624,070 B2 * | 9/2003 | Merricks et al. ......... 438/678 |
| 6,645,557 B2 | 11/2003 | Joshi |
| 6,680,273 B2 * | 1/2004 | Goosey et al. .......... 502/150 |

FOREIGN PATENT DOCUMENTS

SU 519498 A 9/1976

OTHER PUBLICATIONS

Kondo et al., "Acceleration of Electroless Copper Deposition in the Presence of Excess Triethanolamine," The Electrochemical Society, Inc., © 1991, pp. 3629-3633.
ASM Handbook; vol. 5, Surface Engineering; "Electroless Nickel Plating", pp. 290-310; D. Baudrand.

* cited by examiner

*Primary Examiner*—Michael Lebentritt
*Assistant Examiner*—James M Mitchell
(74) *Attorney, Agent, or Firm*—Wells St. John P.S.

(57) ABSTRACT

The invention includes methods of electroless plating of nickel selectively on exposed conductive surfaces relative to exposed insulative surfaces. The electroless plating can utilize a bath which contains triethanolamine, maleic anhydride and at least one nickel salt.

27 Claims, 5 Drawing Sheets

METHODS OF FORMING CONDUCTIVE INTERCONNECTS, AND METHODS OF DEPOSITING NICKEL

RELATED PATENT DATA

This patent resulted from a divisional application of U.S. patent application Ser. No. 10/879,366, which was filed Jun. 28, 2004, and which issued as U.S. Pat. No. 6,933,231 on Aug. 23, 2005.

TECHNICAL FIELD

The invention pertains to methods of forming conductive interconnects, and pertains to methods of depositing nickel.

BACKGROUND OF THE INVENTION

Semiconductor fabrication frequently involves formation of conductive materials within openings, trenches or vias to form conductive interconnects. An exemplary prior art process for forming a conductive interconnect is described with reference to FIGS. 1 and 2.

Referring initially to FIG. 1, a semiconductor construction 10 is shown to comprise a semiconductor base 12 supporting an electrically conductive node 14 and an electrically insulative material 16. Base 12 can comprise, for example, a monocrystalline silicon wafer. Although base 12 is shown having a homogeneous composition, it is to be understood that base 12 can comprise numerous layers and integrated circuit devices (not shown). The combination of base 12 with structures 14 and 16 can be referred to as a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Electrically conductive node 14 can comprise any suitable material or combination of materials, and can, for example, comprise, consist essentially of, or consist of one or both of copper and tungsten.

Electrically insulative material 16 can comprise any of numerous materials, and in some aspects will comprise, consist essentially of one or both of silicon dioxide and silicon nitride. If material 16 comprises silicon dioxide, such can be in either a substantially undoped form, or it can be in a doped form, such as, for example, borophosphosilicate glass (BPSG). Although material 16 is shown as a homogeneous material, it is to be understood that material 16 can comprise a plurality of layers of differing electrically insulative compositions.

An opening 18 extends through material 16 to an upper surface 15 of node 14. The opening 18 has a periphery comprising exposed sidewall surfaces 17 of electrically insulative material 16, and the exposed upper surface 15 of node 14. Opening 18 can have any of numerous shapes, and in some aspects can be a via or trench.

Referring next to FIG. 2, opening 18 is filled with conductive material by first forming a thin adhesive liner 20 within the opening, and subsequently forming a bulk conductive material 22 within the opening to fill the opening.

The liner 20 can comprise a metal nitride (such as, for example, titanium nitride), and the bulk material can comprise a metal (such as, for example, tungsten). The liner 20 and bulk conductive material 22 can be formed by, for example, one or both of atomic layer deposition and chemical vapor deposition. In subsequent processing (not shown) the liner material 20 and bulk conductive material 22 can be removed from over insulative material 16 by, for example, chemical-mechanical polishing, while leaving the liner and conductive material within opening 18. The liner and conductive material remaining within the opening 18 can subsequently be utilized as a conductive interconnect for electrically connecting circuitry (not shown) to node 14.

A difficulty encountered in forming the liner 20 and conductive material 22 within opening 18 is that the deposited materials can pinch off a top of opening 18 during formation of the materials within the opening, and such can cause the opening to be less than uniformly filled with the conductive materials. This can decrease operability of an interconnect ultimately formed in the opening, and in particularly problematic cases can destroy operability of an interconnect. A continuing goal of semiconductor processing is to increase packing density across a surface of a semiconductor wafer, and accordingly to reduce the widths (i.e. increase the critical dimensions) of openings associated with semiconductor constructions. Difficulties associated with deposition of conductive materials within openings are exacerbated as the openings increase in critical dimension. Accordingly, there has been a continuing effort to develop new methods for forming conductive materials within openings.

One of the methods being developed for forming conductive materials within openings is to electroless plate the materials into the openings in a manner such that the conductive materials grow upwardly from a surface of a conductive node at the bottom of the openings. The upward growth of the electroless-plated materials can alleviate, and preferably prevent, the above-discussed problem of the materials pinching off the top of an opening before the materials have completely filled the bottom of the opening.

It has proven to be difficult, however, to develop methods which selectively electroplate conductive materials on conductive surfaces relative to insulative surfaces. If the plated materials grow on insulative surfaces (such as, for example, the surfaces 17 of FIG. 1), the plated materials can pinch off the top of an opening before the materials have filled the opening. Ideally, the plated materials would selectively grow on the conductive surface of an electrically conductive node (such as, for example, the surface 15 of node 14 in FIG. 1), and then continue to selectively grow on conductive surfaces relative to insulative surfaces so that the plated material fills the opening by upward growth from conductive surfaces rather than by lateral or sideward growth from insulative surfaces.

For purposes of interpreting this disclosure and the claims that follow, a deposition process is considered to be "selective" for a first surface relative to a second surface if deposition occurs more rapidly in the first surface than the second surface, which can include, but is not limited to, conditions in which the deposition occurs only on the first surface and not on the second surface (i.e., conditions in which the deposition is 100% selective for the first surface relative to the second surface).

A conductive material which is commonly utilized in electroplating processes is nickel. However, a problem in utilizing nickel to fill openings (such as the opening 18 of FIG. 1) is that it can be difficult to electroless plate the nickel on a conductive surface of copper or tungsten (such as the surface 15 of node 14) without first activating such conductive surface. The activation frequently comprises provision of palladium onto the surface to provide loci for subsequent deposition of nickel during an electroless plating process. Unfortunately, the activation conditions can also form loci on the exposed surfaces 17 of insulative material 16, and accordingly can result in electroless plating of nickel along the lateral surfaces 17 of opening 18. The plating of nickel on the lateral surfaces 17 can lead to lateral growth of the electroless-plated nickel across the opening, which can pinch off the opening before the electroless-plated conductive material has entirely filled the opening.

It is desired to develop new methods for electroless-plating of materials within openings which alleviate, and preferably prevent, the various problems discussed above. It is further desired to develop methods for electroless plating which are selective for plating on conductive surfaces relative to insulative surfaces, and which preferably can be conducted without activation of the conductive surfaces.

SUMMARY OF THE INVENTION

In one aspect, the invention includes a method of depositing nickel. A semiconductor substrate is provided. The substrate has a surface of an electrically conductive node, and also has a surface of an electrically insulative material. The surfaces of the conductive node and the electrically insulative material are both exposed to an electroless plating bath. The bath is utilized for selectively electroless plating nickel on the surface of the node relative to the surface of the electrically insulative material. The plating bath contains triethanolamine, maleic anhydride and at least one nickel salt. The plating bath can further include a reducing agent, such as, for example, dimethyl aminoborane (DMAB).

In one aspect, the invention includes a method of forming a conductive interconnect. A semiconductor substrate is provided. The substrate has an electrically conductive node, an electrically insulative material adjacent the node, and an opening extending through the insulative material to a surface of the node. A sidewall periphery of the opening comprises an exposed surface of the electrically insulative material. Nickel is electroless plated within the opening to form the conductive interconnect within the opening. The electroless plating selectively deposits the nickel on the surface of the node relative to the exposed surface of the electrically insulative material. The electroless plating comprises provision of a bath within the opening, with such bath containing a nickel salt, a metal chelator, triethanolamine, a reducing agent and maleic anhydride.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes a new electroless plating bath chemistry which can selectively plate nickel on materials comprising one or both of copper and tungsten relative to other materials. In particular aspects, the bath is utilized to selectively deposit nickel on an electrically conductive surface relative to an electrically insulative surface, and is utilized without prior activation of the electrically conductive surface. The selectivity of the plating conditions of the present invention for surfaces comprising, consisting essentially of, or consisting of one or both of copper and tungsten relative to electrically insulative surfaces can be very high, with the selectivity approaching 100% (i.e., with the selectivity being such that electroless plating occurs on the surfaces containing copper and/or tungsten while not occurring to a measurable extent on the electrically insulative surfaces) in some aspects of the invention.

Figure 1:
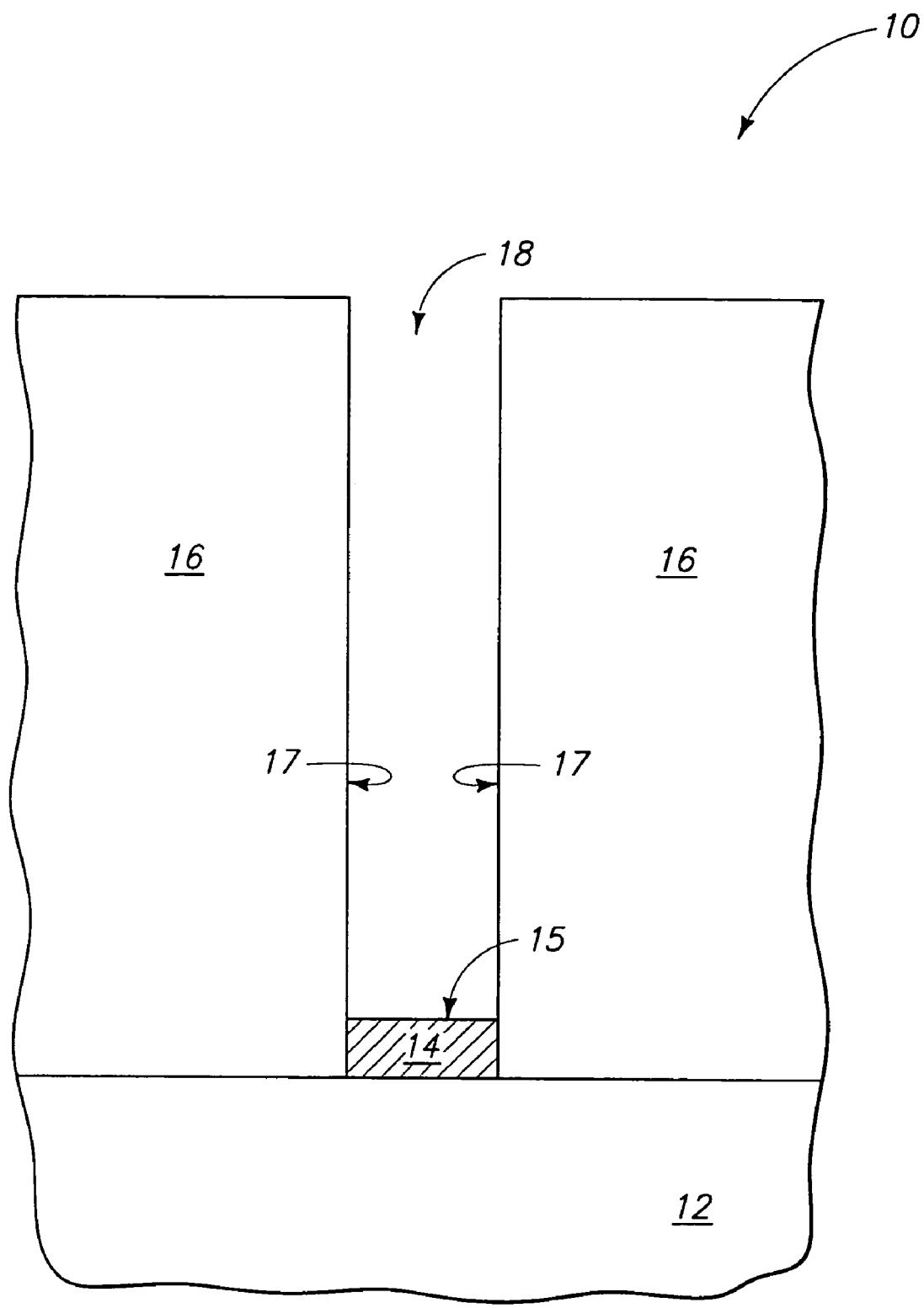
FIG. 1 is a diagrammatic, cross-sectional view of a semiconductor wafer fragment at a preliminary processing stage of a prior art process for forming a conductive interconnect.
Figure 2:
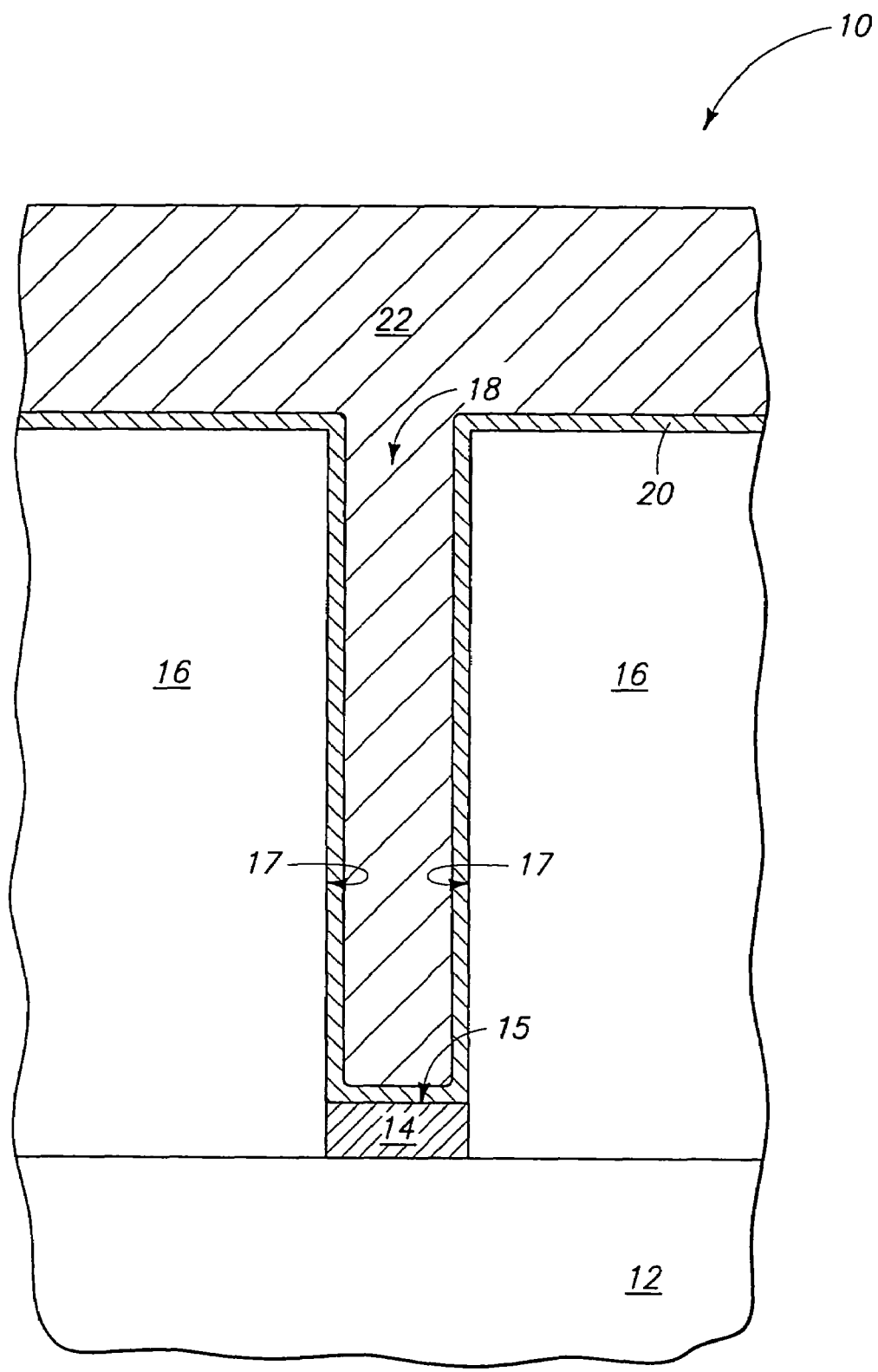
FIG. 2 is a view of the FIG. 1 fragment shown at a prior art processing stage subsequent to that of FIG. 1.
Figure 3:
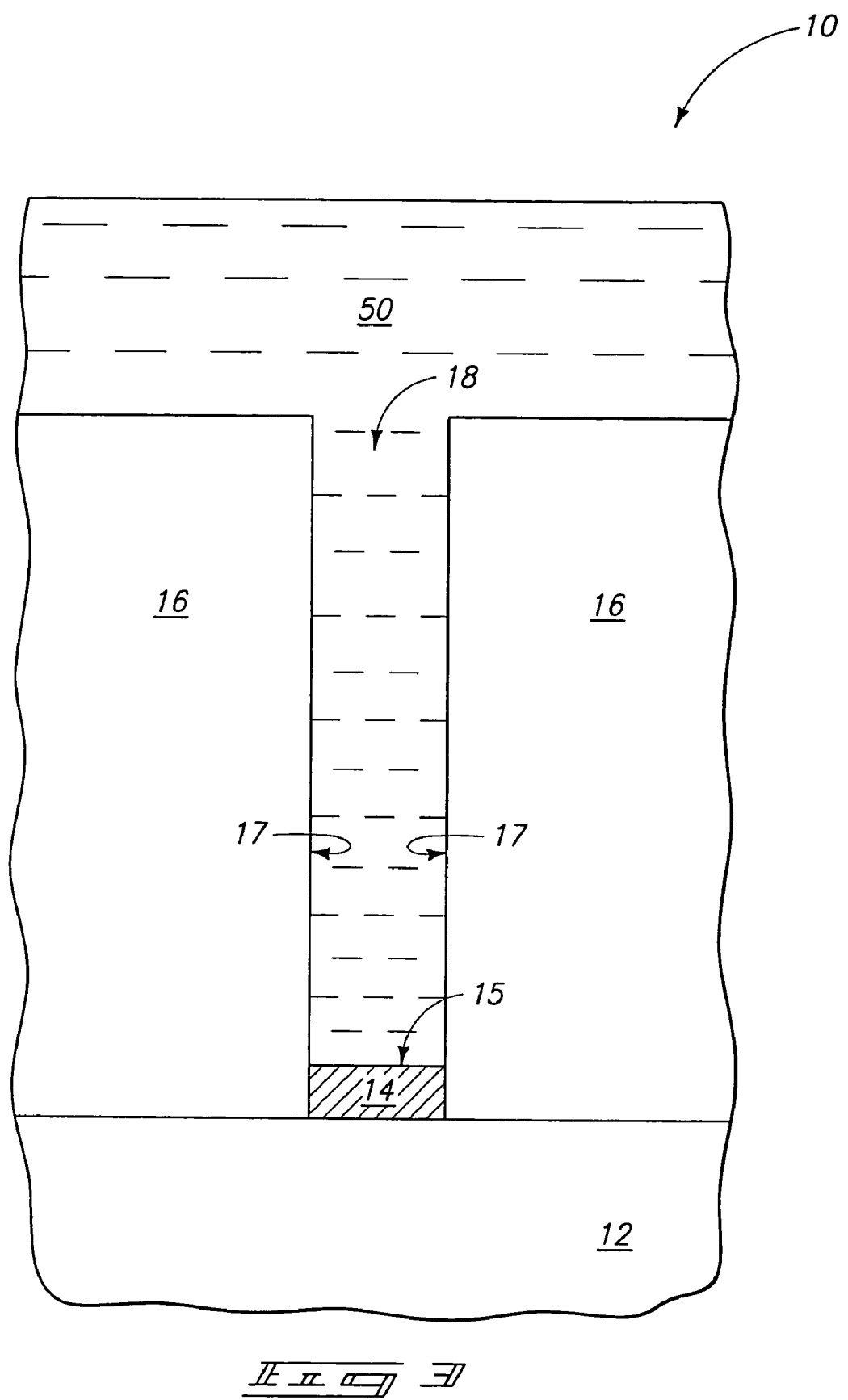
FIG. 3 is a diagrammatic, cross-sectional view of a semiconductor wafer fragment shown at a preliminary processing stage of an exemplary aspect of the present invention.

An exemplary aspect of the invention is described with reference to FIGS. 3-5. Referring initially to FIG. 3, a semiconductor construction 10 is illustrated at a preliminary processing stage of an exemplary method of the invention. In describing construction 10, similar numbering will be used as was utilized above in describing the prior art construction 1. Construction 10 comprises the base 12, electrically insulative material 16 and conductive node 14 described previously. Accordingly, base 12 can comprise a monocrystalline semiconductor wafer together with various levels of integrated circuitry (not shown). Node 14 can comprise, consist essentially of, or consist of one or both of tungsten and copper, and has an exposed uppermost surface 15 which can also comprise, consist essentially of, or consist of one or both of tungsten and copper. Insulative material 16 can comprise any suitable electrically insulative composition, or combination of compositions. In particular aspects, insulative material 16 will comprise, consist essentially of, or consist of one or both of silicon nitride and silicon dioxide. The silicon dioxide can be either undoped, or can be in a doped form, such as, for example, BPSG. The opening 18 extends through insulative material 16 to the upper surface 15 of electrically conductive node 14. Opening 18 has a periphery which includes exposed lateral sidewall surfaces 17 of insulative material 16.

Insulative material 16 can be considered to be adjacent electrically conductive node 14, in that insulative material 16 and conductive material 14 are closely proximate one another (and in the shown aspect of the invention in direct physical contact with one another) over the base 12.

An electroless plating bath 50 is provided over construction 10 and within opening 18. Accordingly, surfaces 15 and 17 are exposed to the electroless plating bath. Bath 50 is utilized for selectively electroless plating nickel on the exposed surface 15 of node 14 relative to the exposed surface 17 of insulative material 16.

Figure 4:
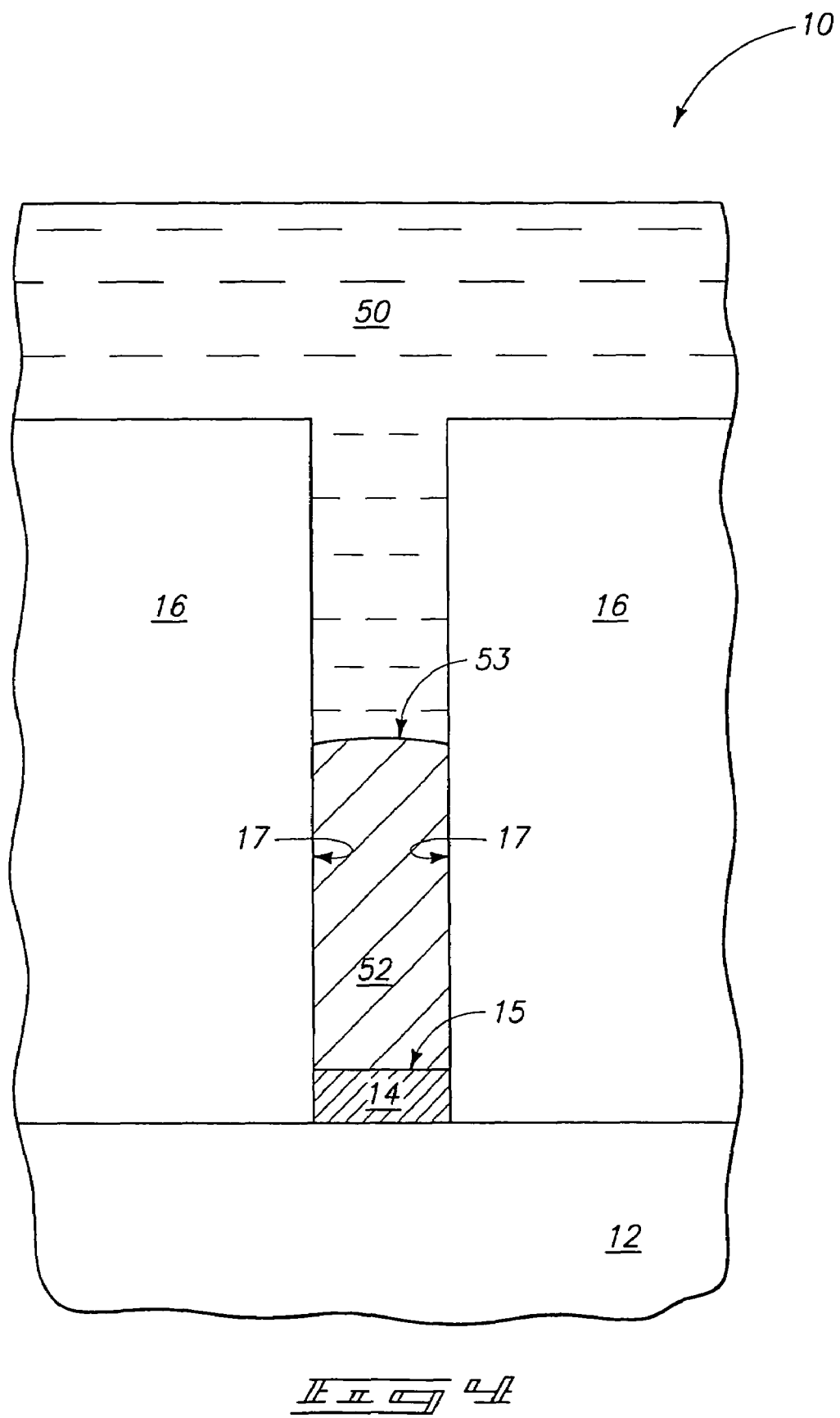
FIG. 4 is a view of the FIG. 3 wafer fragment shown at a processing stage subsequent to that of FIG. 3.

FIG. 4 shows construction 10 after the electroless plating has selectively plated a nickel-containing material 52 onto surface 15 of node 14 relative to insulative surfaces 17.

Material 52 has an uppermost surface 53. Once that material 52 covers node 14, the surface 53 becomes a new conductive node surface within the opening. The electroless plating is preferably selective for electrically conductive surface 53 relative to insulative surfaces 17 so that the nickel-containing material continues growing upwardly within the opening even after node 14 is completely covered by material 52. Accordingly, the electroless plating is preferably selective for depositing nickel onto the conductive surface 53 comprising, consisting essentially of, or consisting of nickel, relative to depositing nickel onto the insulative material surfaces 17.

One aspect of the invention is a recognition that a plating bath containing a combination of triethanolamine, maleic anhydride and at least one nickel salt can selectively electroless plate nickel over electrically conductive surfaces (such as surfaces comprising, consisting essentially of, or consisting of one or more of copper, nickel and tungsten) relative to electrically insulative surfaces. Accordingly, the plating bath can be utilized to uniformly fill an opening with nickel-containing material. A plating bath of the present invention can be utilized without activation of a surface comprising, consisting essentially of, or consisting of tungsten or copper, which can advantageously avoid the above-described prior art problems associated with utilization of activation conditions prior to electroless plating.

In particular aspects, the electroless-plating bath is an aqueous solution in which the triethanolamine is present to a concentration of from about 35 grams per liter to about 80 grams per liter (with a concentration of about 45 grams per liter being typical); the maleic anhydride is present to a concentration of from about 0.5 grams per liter to about 2.5 grams per liter (with a concentration of about 2 grams per liter being typical); and the nickel salt is nickel sulfate present to a concentration of about 20 grams per liter to about 50 grams per liter (with about 30 grams per liter being typical). It is noted that the nickel salt can comprise other nickel salts such as, for example, nickel chloride in addition to or alternatively to the nickel sulfate.

The various components of the plating bath are typically fully dissolved in the bath solution, and accordingly the nickel salt is distributed amongst anions and cations within the bath. Accordingly, if the nickel salt comprises nickel sulfate, the actual composition within the plating bath will be nickel cations and sulfate anions. Further, if other anions besides sulfate are present in the bath, there may be redistribution of the anions so that some of the nickel cations are paired with anions other than sulfate. Regardless, the stoichiometry of nickel and sulfate within the bath will be equivalent to having the nickel sulfate salt within the bath. Accordingly, the bath can be referred to as containing the nickel sulfate salt even though the bath actually contains nickel cations and sulfate anions. Throughout this disclosure and the claims that follow, a plating bath is referred to as containing various salts, and it is to be understood that such description includes aspects in which the salts are fully dissolved in a solution so that the cations and anions of the salts are dispersed within the solution rather than being in crystalline salt form.

The electroless plating bath can include numerous components in addition to the nickel salt, triethanolamine and maleic anhydride discussed above. For instance, the plating bath can also include a metal chelator and a reducing agent. An exemplary metal chelator is a salt of ethylenediaminetetraacetic acid (EDTA), such as, for example, the potassium salt of EDTA. In particular aspects, the potassium salt of EDTA is present in the plating bath to a concentration of from about 10 grams per liter to about 25 grams per liter, with a typical concentration being about 15 grams per liter. The reducing agent can be selected from the group consisting of dimethyl aminoborane, hypophosphate, formaldehyde and one or more hydroborate salts. For instance, the reducing agent can be sodium hydroborate. If the reducing agent is dimethyl aminoborane, such can be present in the plating bath to a concentration of from about 6 grams per liter to about 15 grams per liter, with about 8 grams per liter being typical.

The various components of the plating bath can have numerous purposes and provide numerous advantages. For instance, the triethanolamine can accelerate nickel deposition (plating) on electrically conductive surfaces. As another example, the maleic anhydride can stabilize the plating bath solution so that the nickel remains dissolved in the solution at the high concentration of nickel present. Without the stabilization of maleic anhydride, the nickel would tend to plate less specifically on the conductive materials relative to the insulative materials, and accordingly various prior art problems could manifest from nickel non-specifically plating at the top of an opening before the nickel has fully and uniformly filled the opening.

An electroless plating solution of the present invention can be utilized under any suitable conditions. In particular aspects, the plating solution is utilized while maintaining a pH of the solution at from about 7 to about 9.5 (with from about 8 to about 8.5 being typical), and while maintaining a temperature of the solution at from about 20° C. to about 85° C. (with a temperature of about 60° C. being typical). Electroless plating can be conducted for any suitable time, with a time of from about 1 minute to about 0.5 hours being typical.

Figure 5:
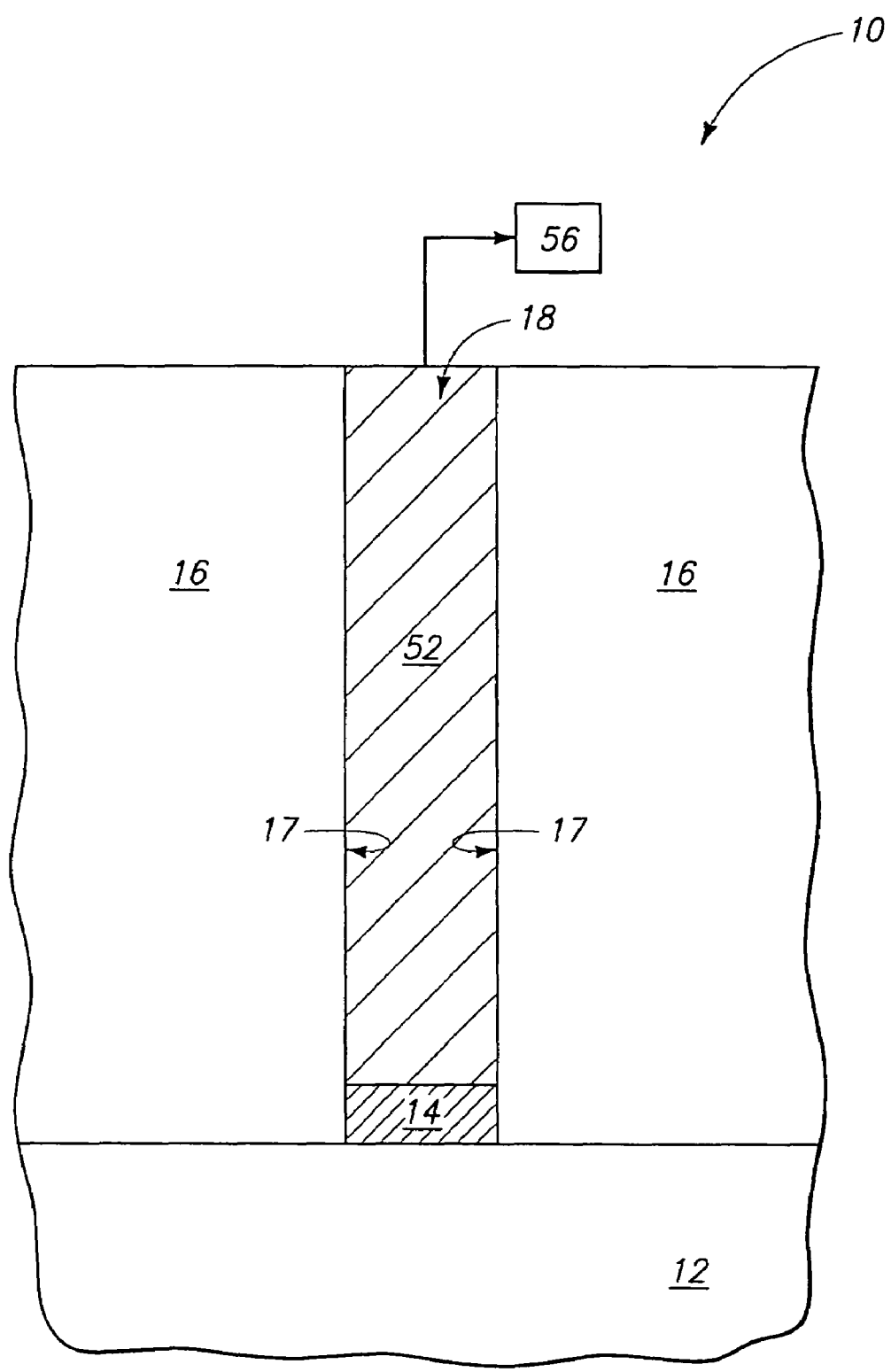
FIG. 5 is a view of the FIG. 3 wafer fragment shown at a processing stage subsequent to that of FIG. 4.

Referring next to FIG. 5, such shows construction 10 after a sufficient amount of nickel-containing material 52 has been electroless plated within opening 18 to fill the opening, and after removal of bath 50 (FIG. 3). In the shown aspect of the invention, the material 52 fully and uniformly fills opening 18.

Material 52 forms a conductive interconnect extending through the opening to node 14, with such interconnect comprising, consisting essentially of, or consisting of nickel. The interconnect has a planarized top surface. Such planarized surface can be formed by, for example, chemical-mechanical polishing subsequent to the formation of the interconnect.

Circuitry 56 is diagrammatically illustrated in FIG. 5 as being electrically connected with the interconnect of material 52. The interconnect thus electrically connects node 14 with the circuitry 56. Persons of ordinary skill in the art will recognize that node 14 can be electrically connected with various integrated circuit devices associated with semiconductor base 12, and that circuitry 56 can correspond to any of numerous structures desired to be connected with circuit devices through electrical interconnects. Accordingly, the electrical interconnect of material 52 can have broad application for incorporation into integrated circuitry fabrication.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a conductive interconnect, comprising:
    providing a semiconductor substrate having an electrically conductive node, an electrically insulative material adjacent the node, and an opening extending through the insulative material to a surface of the node, a sidewall periphery of the opening comprising an exposed surface of the electrically insulative material; and
    electroless plating nickel within the opening to form the conductive interconnect within the opening, the electroless plating selectively depositing the nickel on the surface of the node relative to the exposed surface of the electrically insulative material and comprising providing a plating bath within the opening, the plating bath containing a nickel salt, a metal chelator, triethanolamine, a reducing agent and maleic anhydride.

2. The method of claim 1 wherein the surface of the electrically conductive node comprises copper.

3. The method of claim 1 wherein the surface of the electrically conductive node consists essentially of copper.

4. The method of claim 1 wherein the surface of the electrically conductive node consists of copper.

5. The method of claim 1 wherein the surface of the electrically conductive node consists essentially of tungsten.

6. The method of claim 1 wherein the surface of the electrically conductive node consists of tungsten.

7. The method of claim 1 wherein the surface of the electrically conductive node consists essentially of nickel.

8. The method of claim 1 wherein the surface of the electrically conductive node consists of nickel.

9. The method of claim 1 wherein the exposed surface of the electrically insulative material comprises one or both of silicon nitride and silicon dioxide.

10. The method of claim 1 wherein the triethanolamine is present in the plating bath to a concentration of from about 35 grams per liter to about 80 grams per liter.

11. The method of claim 1 wherein the maleic anhydride is present in the plating bath to a concentration of from about 0.5 grams per liter to about 2.5 grams per liter.

12. The method of claim 1 wherein the nickel salt is nickel chloride.

13. The method of claim 1 wherein the nickel salt is nickel sulfate.

14. The method of claim 13 wherein the nickel sulfate is present in the plating bath to a concentration of from about 20 grams per liter to about 50 grams per liter.

15. The method of claim 1 wherein the reducing agent is dimethyl aminoborane.

16. The method of claim 15 wherein the dimethyl aminoborane is present in the plating bath to a concentration of from about 6 grams per liter to about 15 grams per liter.

17. The method of claim 1 wherein the reducing agent is sodium hydroborate.

18. The method of claim 1 wherein the metal chelator is a salt of ethylenediaminetetraacetic acid.

19. The method of claim 1 wherein the metal chelator is a potassium salt of ethylenediaminetetraacetic acid.

20. The method of claim 19 wherein the potassium salt of the ethylenediaminetetraacetic acid is present in the plating bath to a concentration of from about 10 grams per liter to about 25 grams per liter.

21. The method of claim 1 wherein the electroless plating occurs while the bath is maintained at a temperature of from about 20° C. to about 85° C.

22. The method of claim 1 wherein the electroless plating occurs while a pH of the bath is from about 7 to about 9.5.

23. The method of claim 1 wherein the electroless plating is conducted for a time of from about 1 minute to about 0.5 hours.

24. A method of forming a conductive interconnect, comprising:
    providing a semiconductor substrate having an electrically conductive node, an electrically insulative material adjacent the node, and an opening extending through the insulative material to a surface of the node, a sidewall periphery of the opening comprising an exposed surface of the electrically insulative material;
    electroless plating nickel within the opening to form the conductive interconnect within the opening, the electroless plating selectively depositing the nickel on the surface of the node relative to the exposed surface of the electrically insulative material and comprising providing a plating bath within the opening, the plating bath containing a nickel salt, a metal chelator, triethanolamine, a reducing agent and maleic anhydride; and
    wherein the electroless plating is conducted without prior activation of the surface of the electrically conductive node.

25. A method of forming a conductive interconnect, comprising:
    providing a semiconductor substrate having an electrically conductive node, an electrically insulative material adjacent the node, and an opening extending through the insulative material to a surface of the node, a sidewall periphery of the opening comprising an exposed surface of the electrically insulative material;
    electroless plating nickel within the opening to form the conductive interconnect within the opening, the electroless plating selectively depositing the nickel on the surface of the node relative to the exposed surface of the electrically insulative material and comprising providing a plating bath within the opening, the plating bath containing a nickel salt, a metal chelator, triethanolamine, a reducing agent and maleic anhydride; and
    wherein the surface of the electrically conductive node comprises tungsten.

26. A method of forming a conductive interconnect, comprising:
    providing a semiconductor substrate having an electrically conductive node, an electrically insulative material adjacent the node, and an opening extending through the insulative material to a surface of the node, a sidewall periphery of the opening comprising an exposed surface of the electrically insulative material;
    electroless plating nickel within the opening to form the conductive interconnect within the opening, the electroless plating selectively depositing the nickel on the surface of the node relative to the exposed surface of the electrically insulative material and comprising providing a plating bath within the opening, the plating bath containing a nickel salt, a metal chelator, triethanolamine, a reducing agent and maleic anhydride; and
    wherein the surface of the electrically conductive node comprises nickel.

27. A method of forming a conductive interconnect, comprising:
    providing a semiconductor substrate having an electrically conductive node, an electrically insulative material adjacent the node, and an opening extending through the insulative material to a surface of the node, a sidewall periphery of the opening comprising an exposed surface of the electrically insulative material;

electroless plating nickel within the opening to form the conductive interconnect within the opening, the electroless plating selectively depositing the nickel on the surface of the node relative to the exposed surface of the electrically insulative material and comprising providing a plating bath within the opening, the plating bath containing a nickel salt, a metal chelator, triethanolamine, a reducing agent and maleic anhydride; and wherein the reducing agent is selected from the group consisting of dimethyl aminoborane, hypophosphate, formaldehyde and one or more hydroborate salts.

* * * * *